United States Patent
New

(10) Patent No.: US 6,788,738 B1
(45) Date of Patent: Sep. 7, 2004

(54) FILTER ACCELERATOR FOR A DIGITAL SIGNAL PROCESSOR

(75) Inventor: Bernard J. New, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/548,919

(22) Filed: Apr. 13, 2000

Related U.S. Application Data

(60) Provisional application No. 60/132,975, filed on May 7, 1999.

(51) Int. Cl.$^7$ .............................. H03H 7/30; G06F 17/17
(52) U.S. Cl. ........................ 375/229; 375/219; 375/232; 708/313
(58) Field of Search ................................. 375/229, 219, 375/232; 708/319, 313; 326/39, 41

(56) References Cited

U.S. PATENT DOCUMENTS 6,260,053 B1 * 7/2001 Maulik et al. .............. 708/313

* cited by examiner

Primary Examiner—Stephen Chin
Assistant Examiner—Edith Chang
(74) Attorney, Agent, or Firm—Arthur Joseph Behiel; Lois D. Cartier

(57) ABSTRACT

A method and apparatus to accelerate the evaluation of complex, computationally intense digital signal processing algorithms is disclosed. In one embodiment, a filter accelerator is connected in parallel with a conventional digital signal processor (DSP). The accelerator enhances the speed at which the DSP performs some filtering operations by calculating and maintaining a number of partial results based on a selected number of prior data samples. Each time the DSP receives a new data sample for filtering, the DSP makes use of one or more partial results from the accelerator to speed the calculation of the filtered result. Receipt of the new data sample causes the accelerator to recalculate the partial results, this time using the new data sample. The accelerator thus prepares for receipt of the subsequent data sample, freeing the DSP to perform other operations.

10 Claims, 11 Drawing Sheets

FILTER ACCELERATOR FOR A DIGITAL SIGNAL PROCESSOR

CROSS-REFERENCE TO RELATED APPLICATIONS

This application claims the benefit of co-pending, commonly owned provisional U.S. patent application Ser. No. 60/132,975, invented by Bernard J. New and filed May 7, 1999, which is incorporated herein by reference.

FIELD OF THE INVENTION

This invention relates generally to methods and apparatus for accelerating complex, processor-intensive signal-processing algorithms, in particular algorithms in which the evaluation depends upon a single final data point.

BACKGROUND

Some complex signal processing algorithms depend upon a single final data point to produce a processed result. One such algorithm is the finite-impulse-response (FIR) filter, which is commonly found among the algorithms evaluated by a digital signal processor (DSP).

FIG. 1 is a flowchart 10 of a direct form of a conventional FIR filter. A series of N input data samples is shifted into shift registers $11_1$ through $11_N$. Thus, register $11_1$ contains a current data sample $D_N$ and registers $11_2$ through $11_N$ contain a set of previous data samples $D_4$, $D_3$, $D_2$, and $D_1$.

Registers $11_1$ through $11_N$ present their corresponding data samples $D_1$ through $D_N$ on like-named register output lines. Data samples $D_1$ through $D_N$ are then multiplied in a set of multiply steps $12_1$ through $12_N$ by a respective set of weighting coefficients $C_1$ through $C_N$. Finally, an adder 13 sums the resulting weighted samples to provide a filtered output sample $D_F$, where $D_F = D_1C_1 + D_2C_2 \ldots + D_NC_N$. Output sample $D_F$ is then loaded into an output register 14.

FIG. 2 depicts a typical hardware implementation 20 of the flowchart of FIG. 1, like-numbered elements being the same in both Figures. For ease of illustration, FIG. 2 illustrates a four-tap filter employing weighting coefficients $C_1$–$C_4$. The depicted example is limited to five input samples $D_1$–$D_5$, sample $D_5$ being the newest and sample $D_1$ being the eldest. A register 11, including five individual registers $11_1$ through $11_5$, connects to a multiplier 22 via a multiplexer 24. A register block 26 stores weighting coefficients $C_1$ through $C_4$ in a series of registers $26_1$ through $26_4$ and presents the coefficients to multiplier 22 via a second multiplexer 28.

As depicted below in Table 1, the example begins with the first (eldest) data sample $D_1$ stored in register $11_5$, the second data sample $D_2$ stored in register $11_2$, the third data sample $D_3$ stored in register $11_3$, and the fourth and most recent data sample $D_4$ stored in registers $11_1$ and $11_4$. A new data sample $D_5$ is then received and latched into input register $11_1$ during the first machine cycle (Cycle 1). Multiplexers 24 and 28 then provide the respective contents of registers $11_1$ and $26_1$ (i.e., $D_5$ and $C_1$) to multiplier 22. Multiplier 22 outputs the product $D_5C_1$ to an adder 25, which stores the product $D_5C_1$ in an accumulation register 29.

TABLE 1

| Register | Start | Cycle 1 | Cycle 2 | Cycle 3 | Cycle 4 |
|---|---|---|---|---|---|
| $11_1$ | $D_4$ | $D_5$ | $D_5$ | $D_5$ | $D_5$ |
| $11_2$ | $D_2$ | $D_2$ | $D_5$ | $D_4$ | $D_3$ |
| $11_3$ | $D_3$ | $D_3$ | $D_2$ | $D_5$ | $D_4$ |
| $11_4$ | $D_4$ | $D_4$ | $D_3$ | $D_2$ | $D_5$ |
| $11_5$ | $D_1$ | $D_1$ | $D_4$ | $D_3$ | $D_2$ |

Registers $11_2$ to $11_5$ operate as shift registers. Data sample $D_1$ is shifted into register $11_2$ during the time that data sample $D_1$ is presented to multiplier 22. Thus, for the second machine cycle (Cycle 2), each data sample in shift register 11 is similarly shifted, so that data sample $D_1$ is replaced with data sample $D_4$, data sample $D_4$ is replaced with data sample $D_3$, data sample $D_3$ is replaced with data sample $D_2$, and data sample $D_2$ is replaced with data sample $D_5$ (see Table 1).

Multiplexer 24 selects the D output $D_{OUT}$ of register 11 while multiplexer 28 selects coefficient $C_2$ following the foregoing multiply and shift sequence. Multiplier 22 thus supplies the product $D_4C_2$ to adder 25, which sums the product $D_4C_2$ with the product $D_5C_1$ already in accumulation register 29 and stores the sum (i.e., $D_4C_2 + D_5C_1$) in accumulation register 29. As with data sample $D_5$ data sample $D_4$ is shifted into register $11_2$ while data sample $D_4$ is presented to multiplier 22. Each remaining register $11_3$–$11_5$ is similarly updated, so that the contents of registers $11_1$–$11_5$ are as depicted above for cycle three of Table 1.

The foregoing multiply, accumulate, and shift process continues until each data/coefficient pair is presented to multiplier 22 and the resulting products are summed in accumulation register 29 and then stored in an output register 14. Upon completing of the filtering of data sample $D_5$, the contents of registers $11_1$–$11_5$ are as depicted above for cycle four of Table 1. The filter is then prepared to receive the next data sample $D_6$.

Filter implementation 20 requires N clock cycles to filter each data sample, or one clock cycle for each multiply-accumulate operation performed by multiplier 22 and adder 25. Since many DSP optimized microprocessors can produce the same result in N clock cycles, such an embodiment cannot be used to accelerate the microprocessor.

Some conventional systems employ multiple multiplier/adder pairs operating in parallel to reduce the requisite number of clock cycles and therefore improve speed performance. Unfortunately, such parallel systems are larger, more expensive, and require more power than their sequential counterparts. There is therefore a need for a means of reducing the time required to complete the evaluation of the FIR-filter algorithm without incurring significant increases in power usage, size, and cost.

SUMMARY

The present invention is directed to methods and apparatus for accelerating complex signal-processing tasks, such as FIR filtering. In one embodiment, an FIR-filter accelerator is connected in parallel with a data path in a conventional DSP. The accelerator calculates and maintains a number of partial results based on a selected number of prior data samples. Each time the DSP receives a new data sample for filtering, the DSP makes use of one or more partial results from the accelerator to speed the calculation of the filtered result. The accelerator then recalculates the partial results using the new data sample in preparation for a subsequent data sample.

The filter accelerator can improve the performance of the DSP even if the accelerator hardware operates at a rate slower than that of the DSP. The accelerator can therefore be produced inexpensively by exploiting proven, mass-produced, economical technologies and materials. Moreover, the accelerator can be made relatively small, as the accelerator does not require massively parallel processing means.

DETAILED DESCRIPTION

FIGS. 3A–3I are flowcharts depicting the operation of a three-tap FIR filter accelerator in accordance with an embodiment of the invention. The subscript of a given data sample $D_N$ indicates the relative age of the data sample, the lower the subscript number the older the sample. The filter accelerator conventionally produces a filtered data sample $D_F$ by multiplying three consecutive data samples by three respective weighting coefficients $C_1$, $C_2$, and $C_3$. As described below, the filter accelerator presents filtered data $D_F$ in just one clock cycle using a single multiplier, providing speed performance without the disadvantages of parallel processing solutions.

Figure 1:
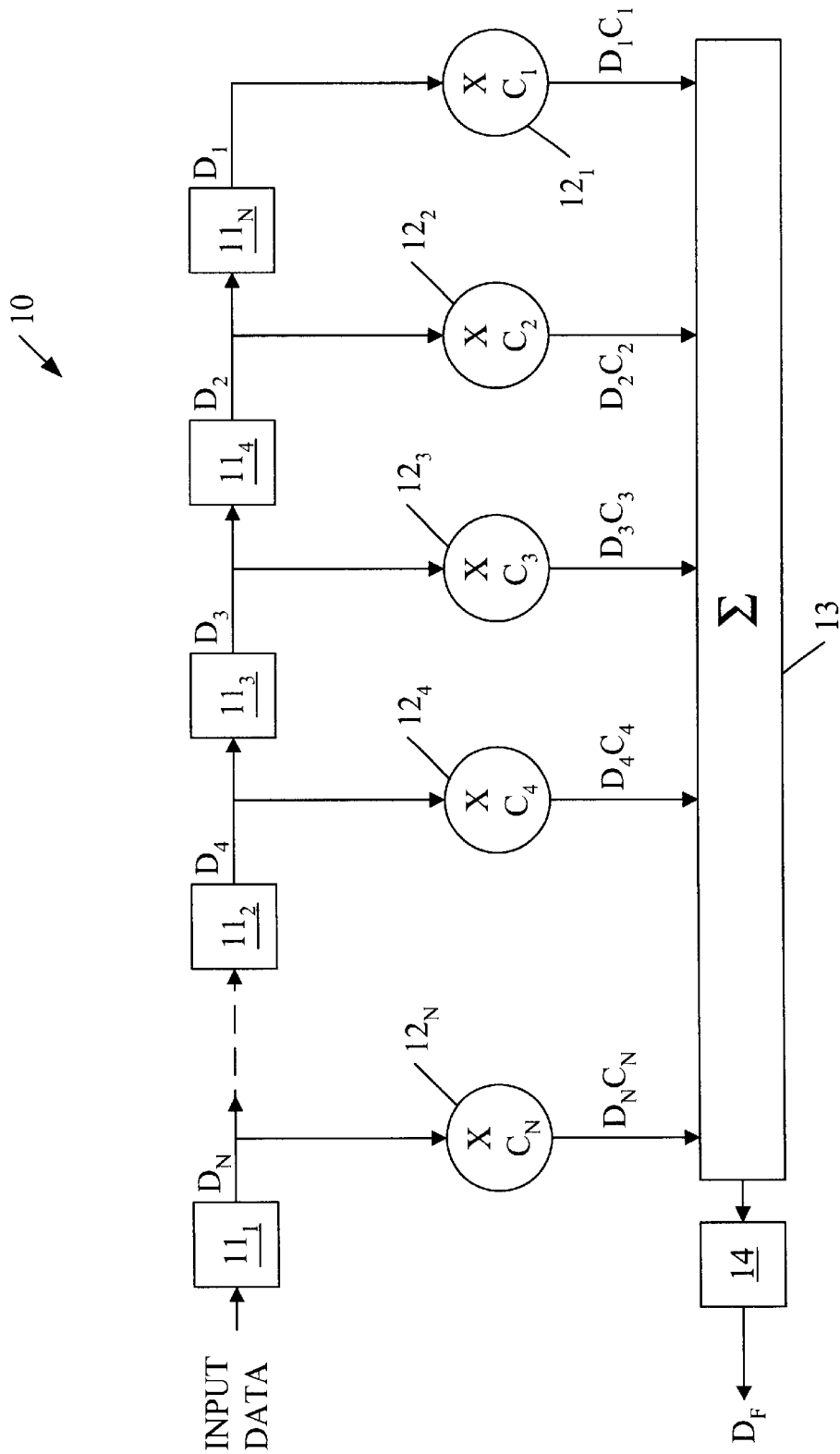
FIG. 1 is a flowchart 10 of a direct form of a conventional FIR filter.
Figure 2:
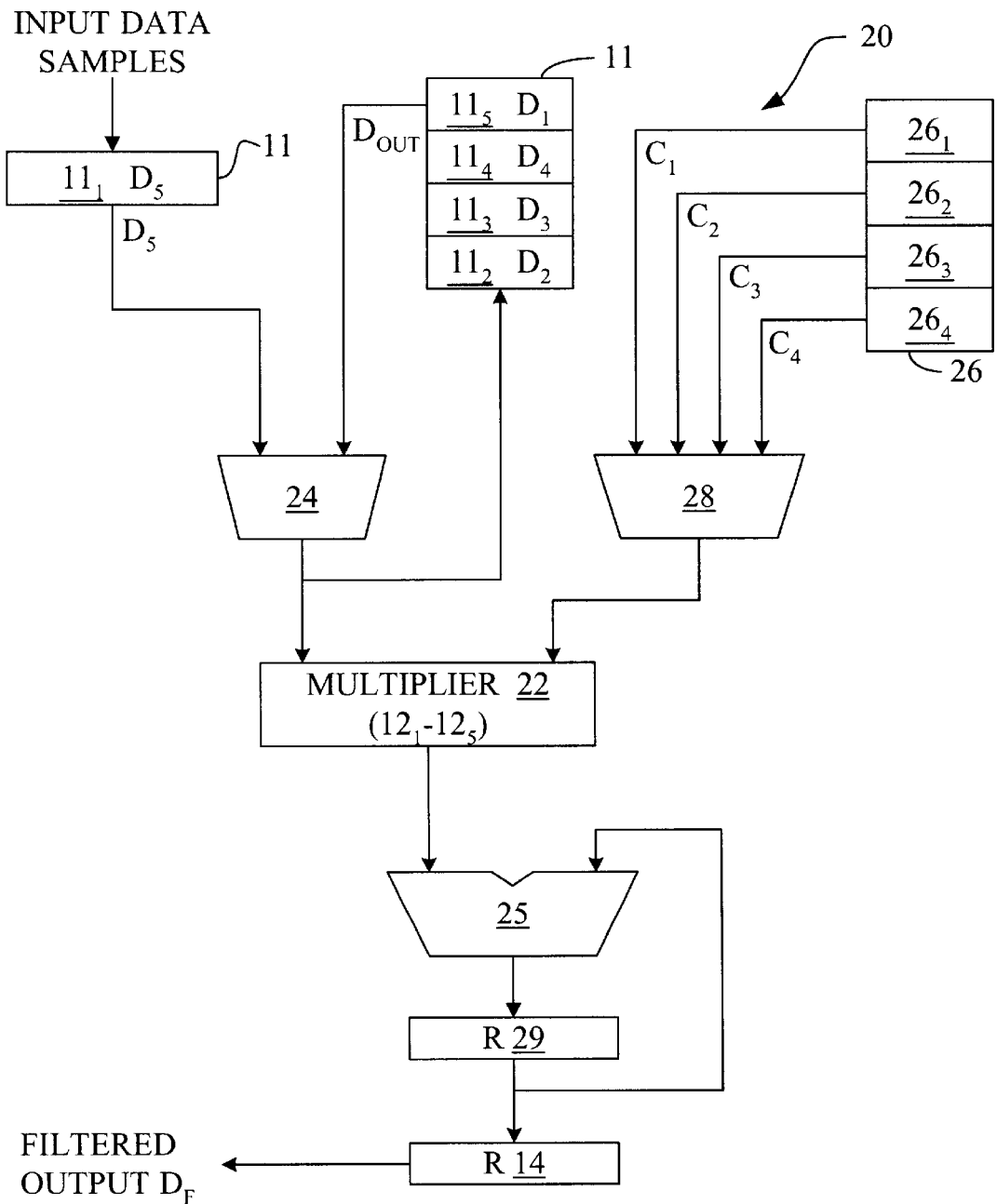
FIG. 2 depicts a typical hardware implementation 20 of the flow chart of FIG. 1.
Figure 3A:
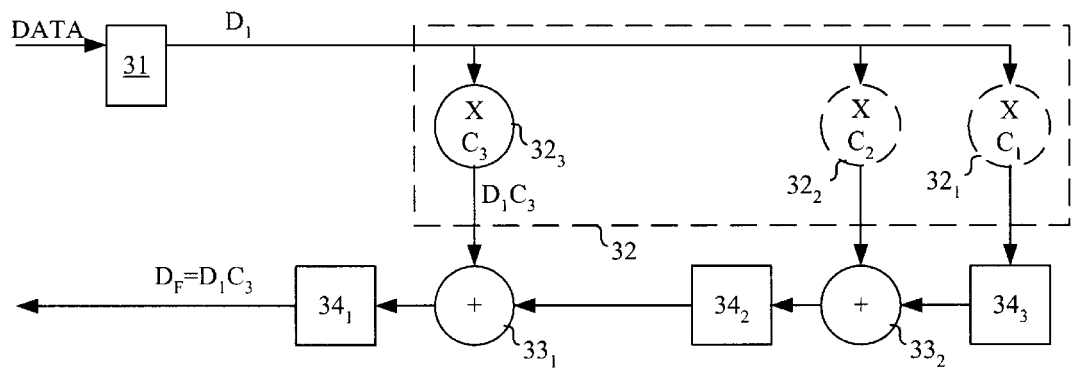
FIGS. 3A–3I are flowcharts depicting the operation of a three-tap FIR filter accelerator in accordance with an embodiment of the invention.
Figure 3B:
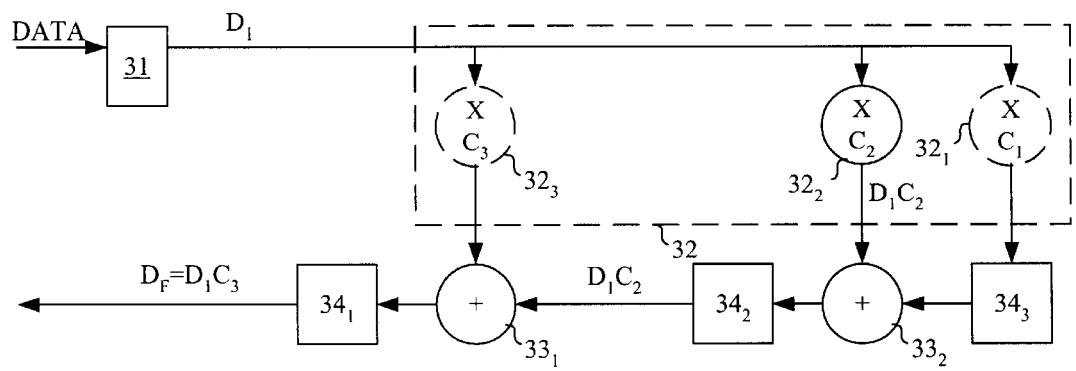
Figure 3C:
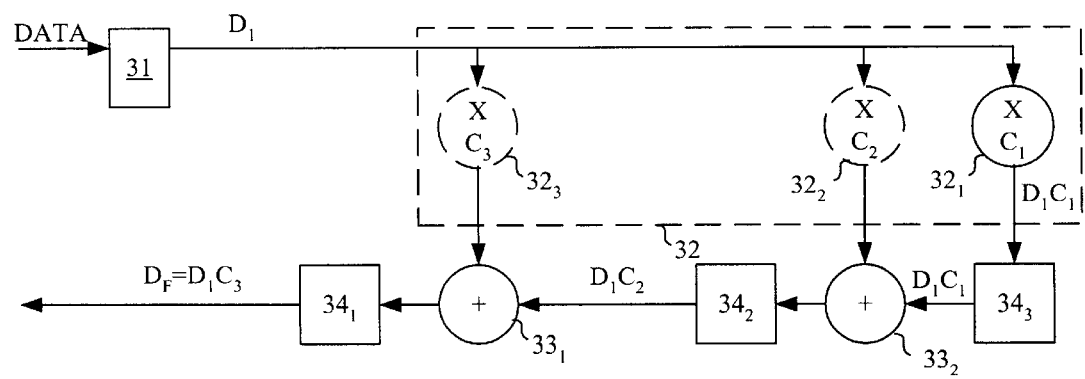

Each flowchart in FIGS. 3A–3I depicts the operation of the filter accelerator during a single clock cycle. Referring first to FIG. 3A, a first input data sample $D_1$ is stored in a data input register 31. Register 31 presents data sample $D_1$ to a weighting-coefficient multiplier 32. Weighting-coefficient multiplier 32 is a single multiplier depicted as including three separate multipliers $32_1$ through $32_3$ to illustrate that multiplier 32 performs three separate multiplications—one per clock cycle—for each input data sample. Multipliers $32_3$, $32_2$, and $32_1$ respectively symbolize the first, second, and third multiplications.

During the first clock cycle, multiplier 32 multiplies data sample $D_1$ by a weighting coefficient $C_3$ using multiplier $32_3$. (In each of FIGS. 3A–3I, the active multiplication is highlighted using a multiplier symbol having a solid boundary, whereas the inactive multiplications are contrasted using multiplier symbols with broken boundaries.) Multiplier $32_3$ provides a data-sample product $D_1C_3$ to an adder $33_1$. This adder adds data-sample product $D_3C_3$ with the contents of a register $34_2$ and stores the filtered result $D_F$ in sum-of-products register $34_1$, the output register of the filter accelerator. The depicted accelerator has three taps, and so when started requires three data samples before producing the first filtered output. Data sample $D_1$ is assumed to be the first data sample, so the filtered output $D_F$ is incomplete.

During the second clock cycle (FIG. 3B), multiplier 32 multiplies data sample $D_1$ by a second weighting coefficient $C_2$, sums this product $D_1C_2$ with the contents of a register $34_3$, and stores the result in a register $34_2$. Register $34_3$ is thus far empty, so register $34_2$ stores the product $D_1C_2$. In the third clock cycle (FIG. 3C), multiplier 32 multiplies data sample $D_1$ by a third weighting coefficient $C_1$ and stores the resulting product $D_1C_1$ in register $34_3$.

Figure 3D:
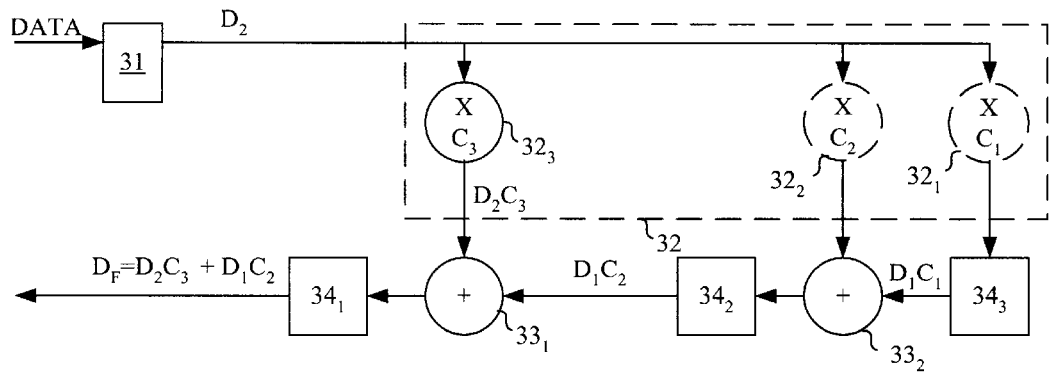
Figure 3E:
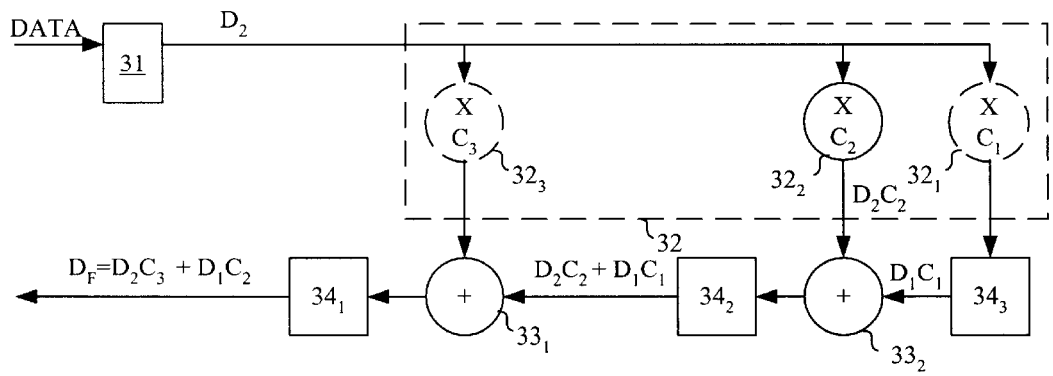
Figure 3F:
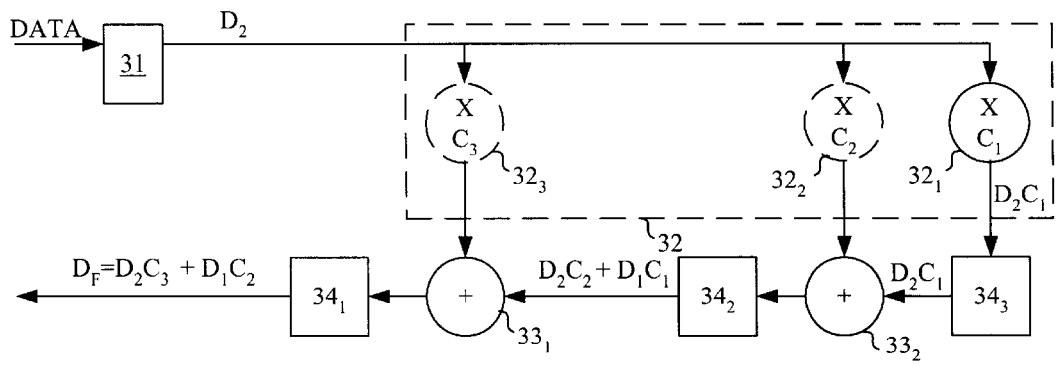

FIGS. 3D, 3E, and 3F illustrate the receipt and processing of a second input data sample $D_2$. Multiplier 32 multiplies data $D_2$ by coefficient $C_3$ during the first clock cycle following the receipt of sample $D_2$. Adder $33_1$ adds the resulting data-sample product $D_2C_3$ to the contents of register $34_2$ obtained during the processing of the previous data sample $D_1$. The resulting sum of products is stored as a filtered result $D_F$ in register $34_1$. The filtered result is still incomplete, as a three-tap filter requires three input data samples upon which to base a result.

During the second clock cycle (FIG. 3E), multiplier 32 multiplies data sample $D_2$ by coefficient $C_2$ and adder $33_2$ adds the resulting product $D_2C_2$ with the contents of a register $34_3$. A second sum-of-products register $34_2$ captures the resulting sum of products ($D_2C_2+D_1C_1$). In the third clock cycle (FIG. 3F), register $34_3$ captures the product of data sample $D_2$ and coefficient $C_1$.

Figure 3G:
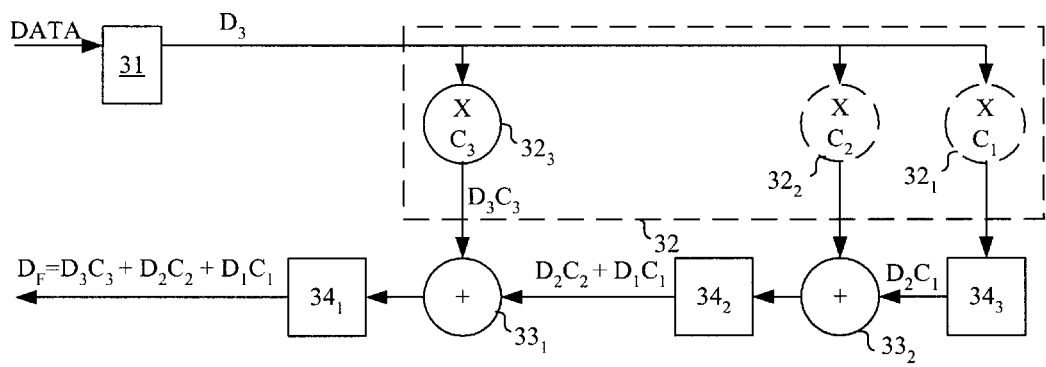
Figure 3H:
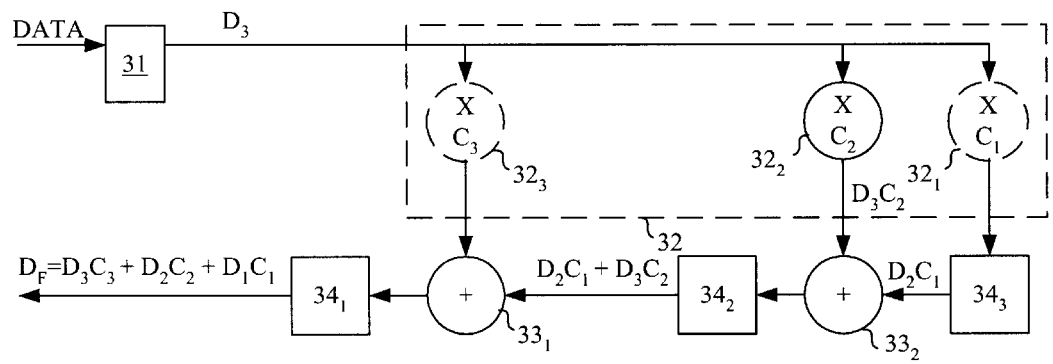
Figure 3I:
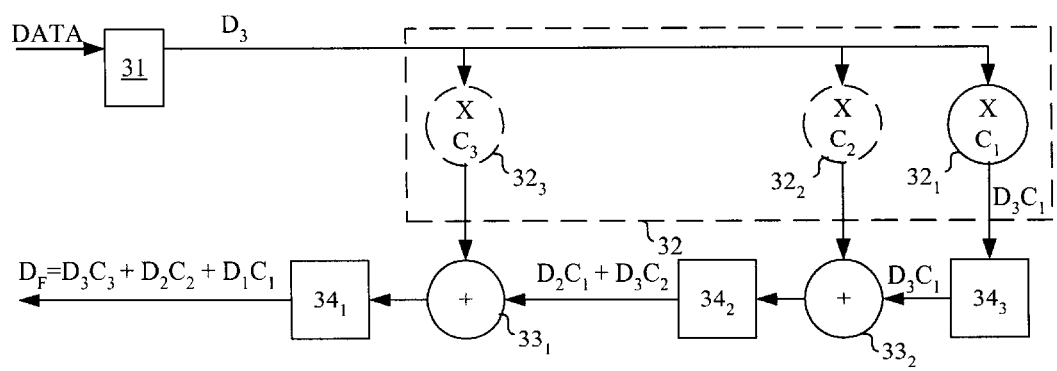

FIGS. 3G, 3H, and 3I illustrate the receipt of a third input data sample $D_3$. The third data sample $D_3$ is the first for which the three-tap filter has enough data to produce a filtered result. During the first clock cycle after receipt of the third sample $D_3$, multiplier 32 multiplies data sample $D_3$ by coefficient $C_3$. Adder $33_1$ adds the resulting data-sample product $D_3C_3$ to the contents of register $34_2$ ($D_2C_2+D_1C_1$) obtained during the processing of the previous data samples $D_1$ and $D_2$. The resulting sum of products is stored as a filtered result $D_F$ in register $34_1$. Importantly, the filtered result $D_F=D_3C_3+D_2C_2+D_1C_1$ is the first correct filtered result after receiving data sample $D_3$, and is available after only one clock cycle. As shown in FIGS. 3H and 3I, registers $34_2$ and $34_3$ are then updated using data sample $D_3$ during the second and third clock cycles in the manner described above in connection with FIGS. 3A–3F. The method of FIGS. 3A–3I produces a filtered result before the partial-results in registers $34_2$ and $34_3$ are updated. The steps illustrated in FIGS. 3G, 3H, and 3I are then repeated for each new data sample.

Figure 4:
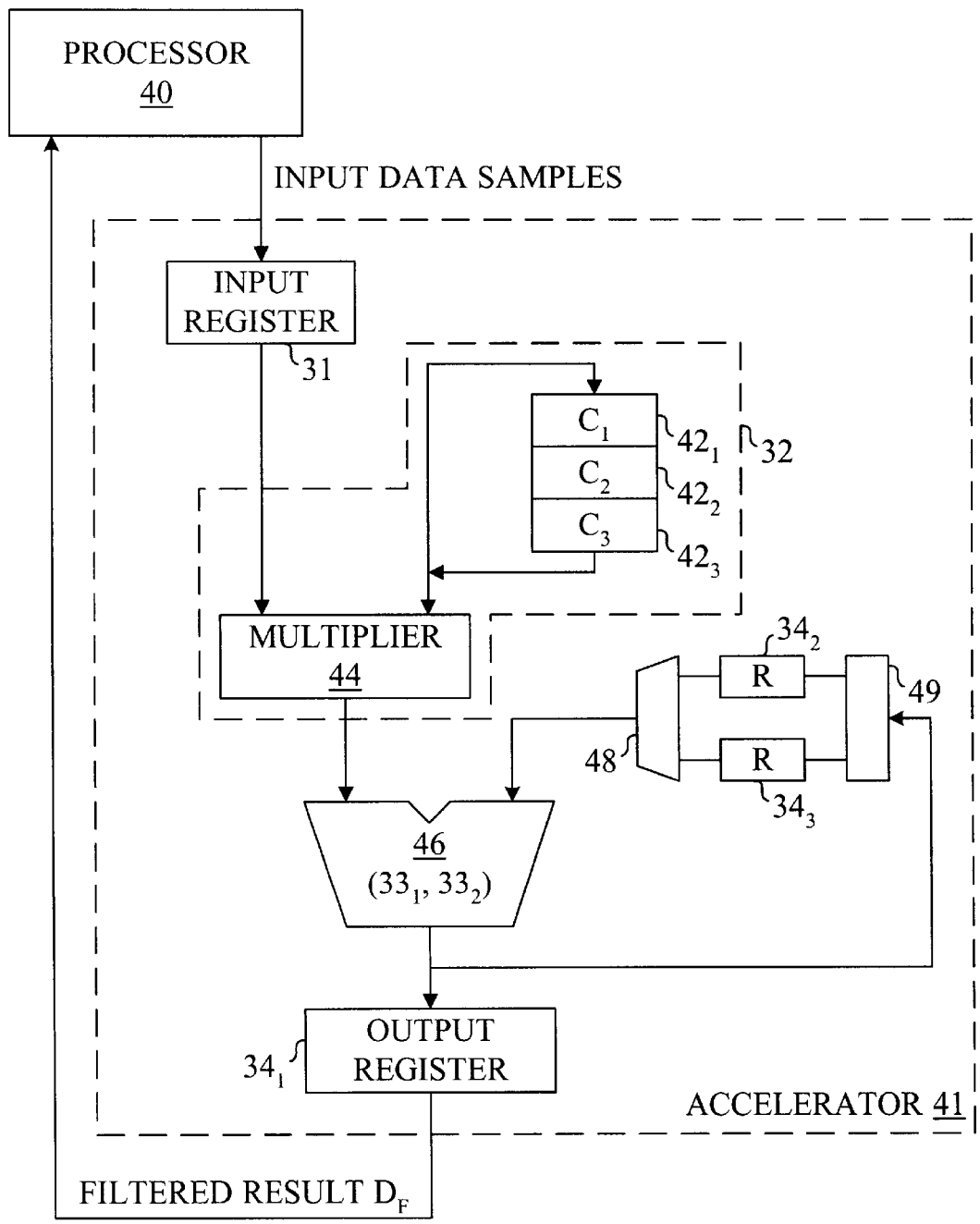
FIG. 4 is a block diagram of an accelerator 41 in accordance with the invention.

FIG. 4 is a block diagram of a DSP-optimized processor 40 connected to an FIR-filter accelerator 41 that performs the method of FIGS. 3A–3I to produce a filtered output $D_F$ in a single clock cycle. Accelerator 41 is a hardware implementation of the flowcharts of FIGS. 3A–3I, like-numbered elements being the same. In addition to the registers depicted in FIGS. 3A–3I, accelerator 41 includes:

1. three coefficient shift registers $42_1$ through $42_3$, which contain respective weighting coefficients $C_1$ through $C_3$;
2. a multiplier 44 that sequentially performs the multiplications represented as weighting-coefficient multipliers $32_1$ through $32_3$ in FIGS. 3A–3I;
3. an adder 46 (or ALU) that sequentially performs the summations represented by data-sample adders $33_1$ and $33_2$ in FIGS. 3A–3I;
4. a multiplexer 48 for selecting one or the other of the contents of partial-result registers $34_2$ and $34_3$; and
5. a de-multiplexer 49 for storing the output from adder 46 in a selected one of partial-result registers $34_2$ and $34_3$.

Processor 40 presents each new input data sample $D_x$ to multiplier 44 via input register 31. Multiplier 44 then multiplies data sample $D_x$ by each of the plurality of weighting coefficients $C_1$ through $C_3$. This is accomplished sequentially by successively shifting weighting coefficients $C_3$ through $C_1$ through coefficient shift registers $42_3$ through $42_1$ to present each, in turn, to multiplier 44.

As products are made available to adder 46, adder 46:

1. adds the first data-sample product, $D_xC_3$, to the output of partial-result register $34_2$ and stores the result in output register $34_1$;
2. adds the second data-sample product, $D_xC_2$, to the output of partial-result register $34_3$ and stores the result in partial-result register $34_2$;
3. directs the last data-sample product, $D_xC_1$, to partial-result register $34_3$; and
4. pauses, awaiting the next input data sample $D_{(x+1)}$.

Output register $34_1$ contains filtered result $D_F$ as soon as the foregoing step one is accomplished; steps two through four can then be accomplished during successive clock cycles while accelerator 41 awaits the next input data sample from processor 40. Thus, processor 40 can retrieve the result and continue executing instructions with a minimum of delay. Further, this delay does not depend upon the number of input data samples used to calculate the filtered result.

Figure 5:
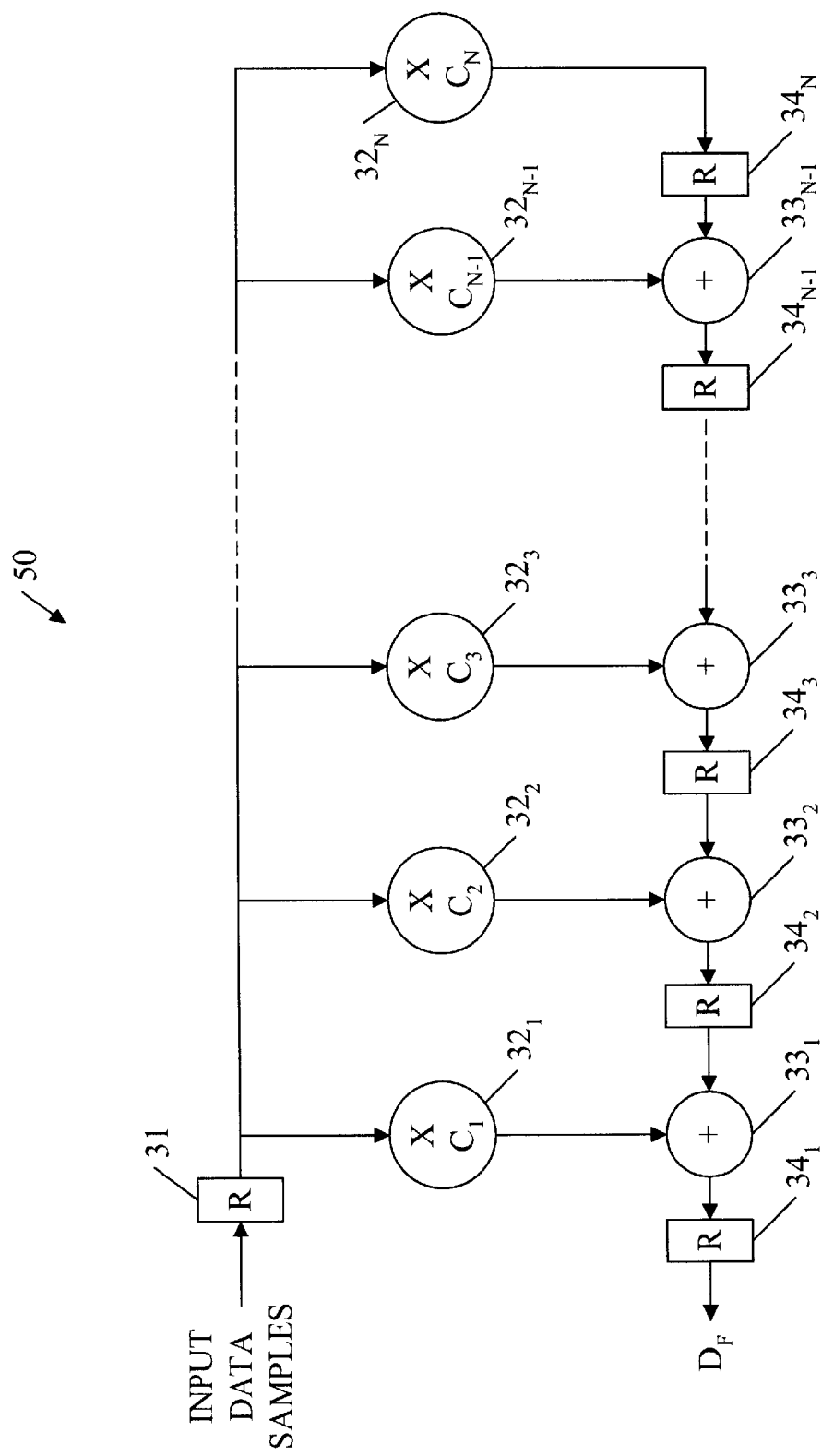
FIG. 5 is a flowchart 50 depicting the operation of a FIR filter accelerator in accordance with the present invention.

FIG. 5 is a flowchart 50 depicting the operation of a filter accelerator in accordance with an embodiment of the invention. Flowchart 50 is similar to the flowcharts of FIGS. 3A–3I, like-numbered elements being the same; however, where the flowcharts of FIGS. 3A–3I represent a method that accommodates three consecutive input data samples, flowchart 50 represents a method that accommodates N consecutive input data samples. In every case, the filtered result is made available one clock cycle after the data sample of interest is latched into input register 31. While there is no particular limit to the number of consecutive data samples used in the filter calculation, if the number is too great, the accelerator will not be able to update each partial-result register before receiving the next data sample.

Figure 6:
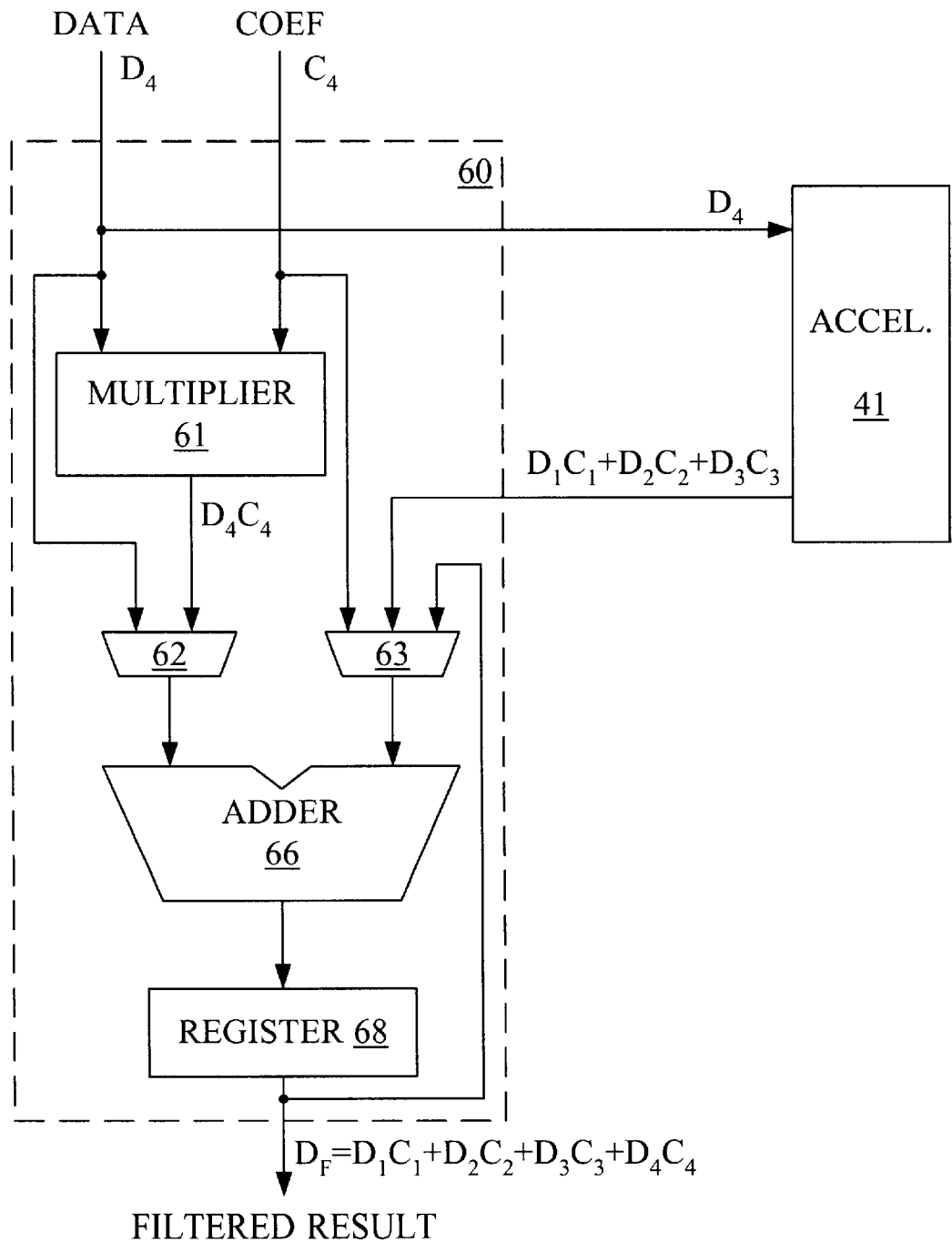
FIG. 6 is a block diagram of a datapath 60 connected to accelerator 41 of FIG. 4.

FIG. 6 is a block diagram of a portion of a datapath 60 in a DSP-optimized processor connected to accelerator 41 of FIG. 4. In this configuration, accelerator 41 speeds the operation of datapath 60 in implementing a four-tap FIR filter.

Datapath 60 includes a multiplier 61, a pair of multiplexers 62 and 63, an adder 66, and an output register 68. Multiplexers 62 and 63 route data and coefficients around multiplier 61 during processes that do not use accelerator 41.

To make use of accelerator 41 to filter a sequence of data samples, datapath 60 routes each new input-data sample $D_4$ to multiplier 61 and to accelerator 41. Multiplier 61 multiplies input-data sample $D_4$ by a weighting-coefficient $C_4$ and presents the resulting product, $D_4C_4$, to adder 66 via multiplexer 62. Then, before output register $34_1$ of accelerator 41 (now a partial-result register) is updated with new results based upon new input-data sample $D_4$, adder 66 adds the contents of output register $34_1$ (FIG. 4) to the output of multiplier 61. The resulting sum $(D_4C_4+D_3C_3+D_2C_2+D_1C_1)$ is then shifted into output register 68 and presented at the output of datapath 60. The partial results in registers $34_2$ and $34_3$ (FIGS. 3A–3I and 4) of accelerator 41 are then updated using data sample $D_4$. Datapath 60 is free to perform some other useful work as accelerator 41 updates partial-result registers $34_2$ and $34_3$ in anticipation of a subsequent data sample.

The combination of datapath 60 and accelerator 41 provides filtered result $D_F$ based on data samples $D_1$ through $D_4$ in the time required for multiplier 61 and adder 66 to perform a single multiply/accumulate operation. Datapath 60 is therefore able to produce a filtered result based on four data samples in a single machine cycle. Moreover, accelerator 41 can be extended to handle more than three input samples, as shown in FIG. 5, for example.

Because FIR accelerator 41 prepares partial results between data samples, speed and latency differences between datapath 60 and accelerator 41 are of little consequence; therefore, accelerator 41 can have a slower clock speed than datapath 60, and consequently can be designed to minimize cost. The filter accelerator can improve the performance of the DSP even if the accelerator is slow relative to the DSP. Thus, accelerator 41 can be implemented in hardware or software using any number of technologies, including programmable logic devices and application-specific integrated circuits. Moreover, the reduced speed sensitivity of the accelerator allows the accelerator to be produced inexpensively by exploiting proven, mass-produced, economical technologies and materials. In another embodiment, accelerator 41 can be time-shared among multiple DSPs, thereby providing additional savings in size, cost, and complexity.

FIGS. 7A–7I are flowcharts depicting the operation of a filter accelerator in accordance with another embodiment of the invention. The depicted accelerator includes three taps for simplicity, but can be adapted for use with more or fewer taps. As in previous examples, the subscript of a given data sample $D_N$ indicates the relative age of the data sample, the lower the subscript number the older the sample. The filter accelerator conventionally produces a filtered data sample $D_F$ by multiplying three consecutive data samples by three respective weighting coefficients $C_1$, $C_2$, and $C_3$. The filter accelerator presents filtered data $D_F$ in just one clock cycle using a single multiplier.

Figure 7A:
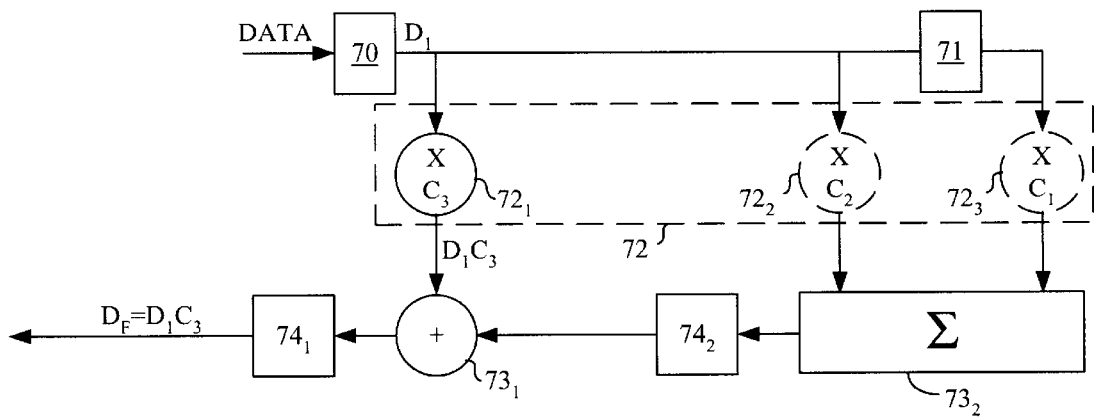
FIGS. 7A–7I are flowcharts depicting the operation of a three-tap FIR filter accelerator in accordance with another embodiment of the invention.
Figure 7B:
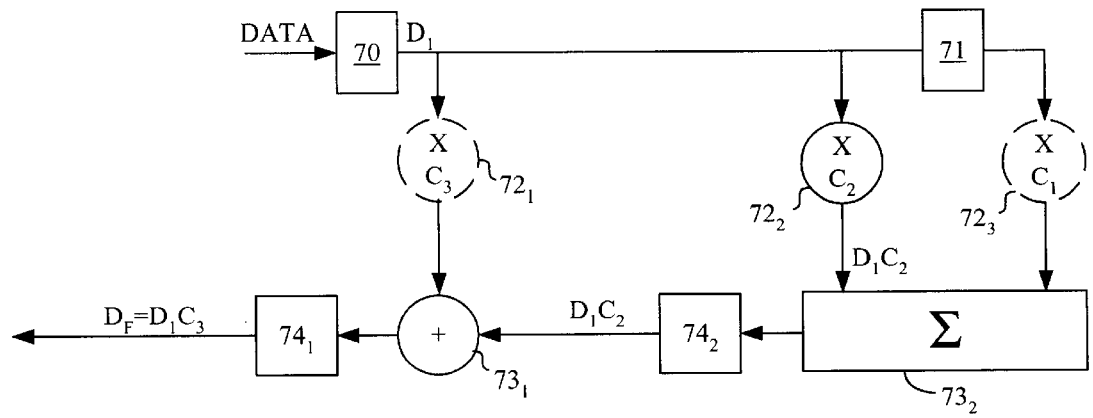
Figure 7C:
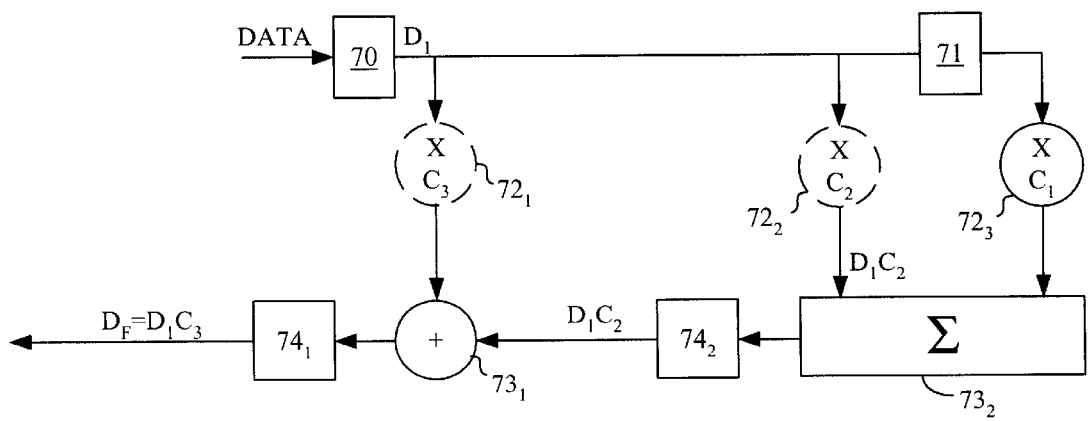

Each flowchart in FIGS. 7A–7I depicts the operation of the filter accelerator during a single clock cycle. Referring first to FIG. 7A, a first input data sample $D_1$ is stored in a data input register 70. Register 70 presents data sample $D_1$ to a weighting-coefficient multiplier 72. Weighting-coefficient multiplier 72 is a single multiplier depicted as including three separate multipliers $72_1$ through $72_3$ to illustrate that multiplier 72 performs three separate multiplications—one per clock cycle—for each input data sample. Multipliers $72_1$, $72_2$, and $72_3$ respectively symbolize the first, second, and third multiplications.

During the first clock cycle, multiplier 72 multiplies data sample $D_1$ by a weighting coefficient $C_3$ using multiplier $72_1$. (In each of FIGS. 7A–7L, the active multiplication is highlighted using a multiplier symbol $72_X$ having a solid boundary, whereas the inactive multiplications are contrasted using multiplier symbols $72_X$ with broken boundaries.) Multiplier $72_1$ provides a data-sample product $D_1C_3$ to an adder $73_1$. This adder adds data-sample product $D_1C_3$ with the contents of a partial-result register $74_2$ and stores the filtered result $D_F$ in sum-of-products register $74_1$, the output register of the filter accelerator. The depicted accelerator has three taps, and so when started requires three data samples before producing the first filtered output. Data sample $D_1$ is assumed to be the first data sample, so the filtered output $D_F$ is incomplete.

During the second clock cycle (FIG. 7B), multiplier 72 multiplies data sample $D_1$ by a second weighting coefficient $C_2$ and stores the product $D_1C_2$ in a partial-result register $74_2$. In the third clock cycle (FIG. 7C), multiplier 72 multiplies the contents of a data register 71 by a third weighting coefficient $C_1$. In the example, data sample $D_1$ is the first data sample. Consequently, register 71 is empty before receipt of sample $D_2$, the second data sample. The resulting product from multiplier $72_3$ is therefore $0(C_1)$, or zero. An adder $73_2$ adds this zero to the contents of register $74_2$ and stores the resulting sum back in register $74_2$. The sum initially stored in register $74_2$ is therefore $D_1C_2 + 0(C_1)$, or $D_1C_2$. Adders $73_1$ and $73_2$ are depicted as separate for illustrative purposes, but can be implemented using a single adder.

Figure 7D:
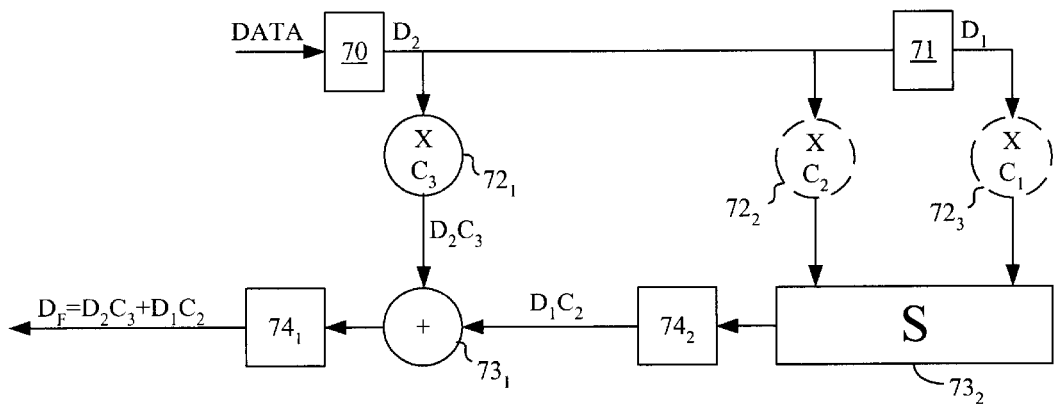
Figure 7E:
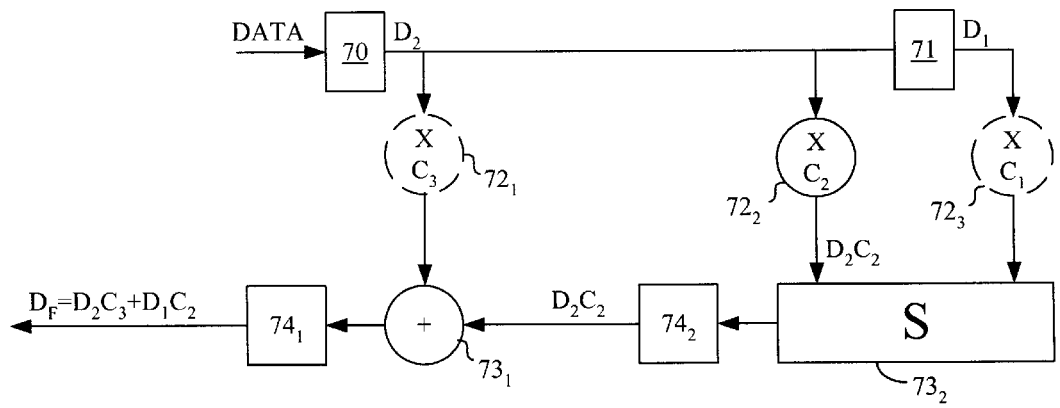
Figure 7F:
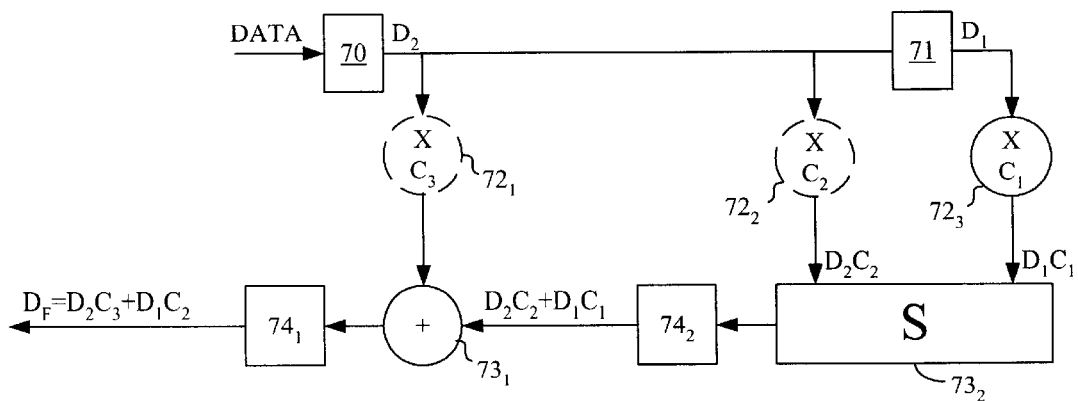

FIGS. 7D, 7E, and 7F illustrate the receipt and processing of a second input data sample $D_2$. The previous data sample $D_1$ shifts into register 71 as data sample $D_2$ shifts into register 70. Multiplier $72_1$ then multiplies data sample $D_2$ by coefficient $C_3$ during the first clock cycle following the receipt of sample $D_2$. Adder $73_1$ adds the resulting data-sample product $D_2C_3$ to the contents of register $74_2$ obtained during the processing of the previous data sample $D_1$. The resulting sum of products is stored as a filtered result $D_F$ in register $74_1$. The filtered result is still incomplete, as the three-tap filter requires three input data samples upon which to base a correct result.

During the second clock cycle (FIG. 7E), multiplier $72_2$ multiplies data sample $D_2$ by coefficient $C_2$. Adder $73_2$ stores the resulting product $D_2C_2$ in partial-result register $74_2$. In the third clock cycle (FIG. 7F), multiplier $72_3$ multiplies data sample $D_1$ by coefficient $C_1$, and adder $73_2$ sums the resulting product $D_1C_1$ with the product $D_2C_2$ in partial-result register $74_2$. The resulting sum of products $(D_1C_1+D_2C_2)$ is stored in partial-result register $74_2$.

Figure 7G:
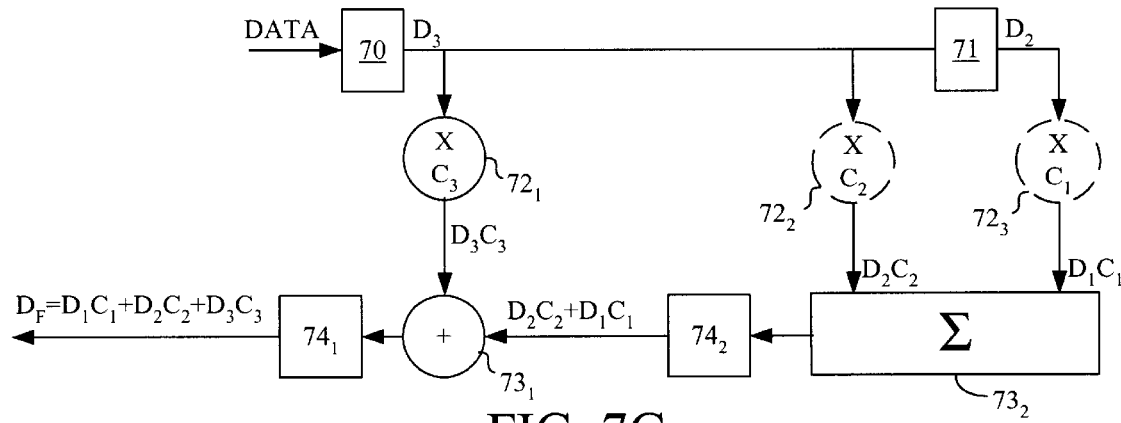
Figure 7H:
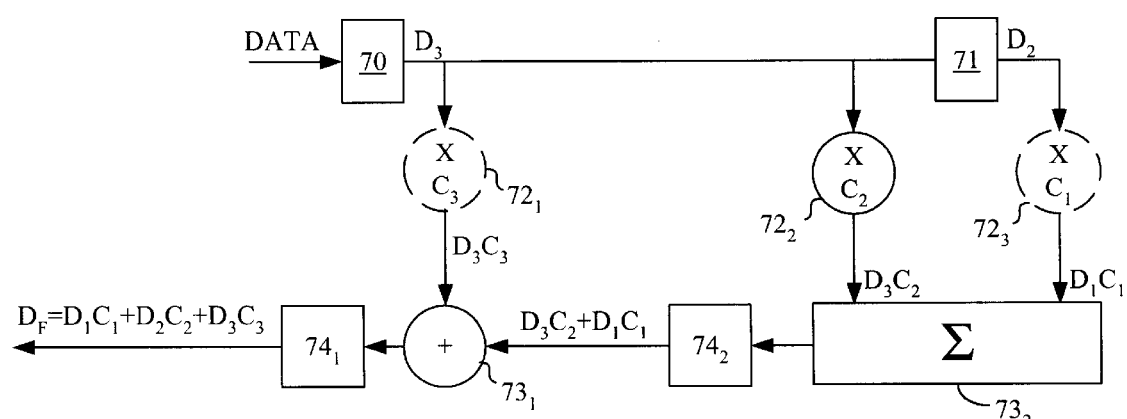
Figure 7I:
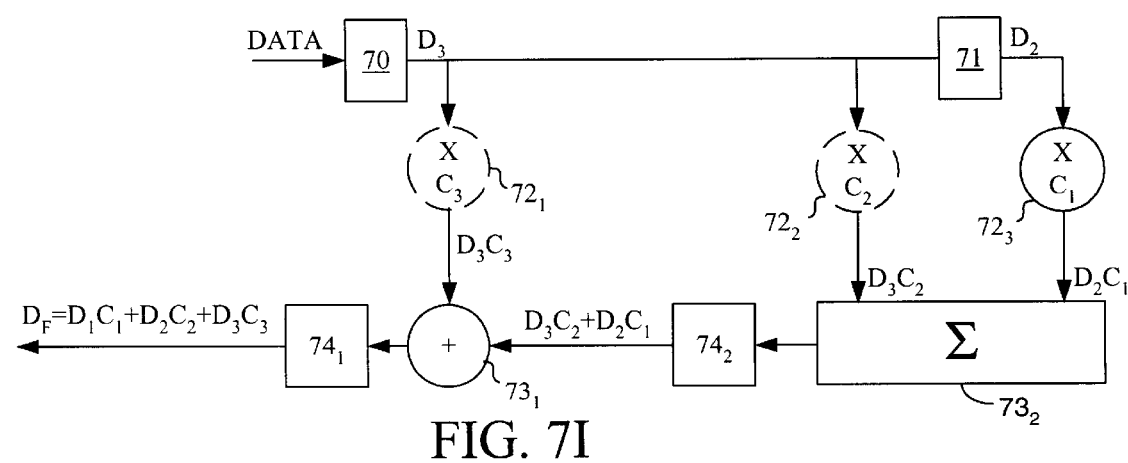

FIGS. 7G, 7H, and 7I illustrate the receipt of a third input data sample $D_3$. The third data sample $D_3$ is the first for which the three-tap filter has enough data to produce a correct filtered result. During the first clock cycle after receipt of the third sample $D_3$, multiplier $72_1$ multiplies data sample $D_3$ by coefficient $C_3$. Adder $73_1$ adds the resulting data-sample product $D_3C_3$ to the contents of register $74_2$ $(D_2C_2 + D_1C_1)$ obtained during the processing of the previous data samples $D_1$ and $D_2$. The resulting sum of products is stored as a filtered result $D_F$ in register $74_1$. Importantly, the filtered result $D_F=D_1C_1+D_2C_2+D_3C_3$ is the first correct filtered result produced from the input data samples, and is available after only one clock cycle from receipt of data sample $D_3$. As shown in FIGS. 7H and 7I, register $74_2$ is then updated using data samples $D_2$ and $D_3$ during the second and third clock cycles in the manner described above in connection with FIGS. 7A–7F. The method of FIGS. 7A–7I thus produces a filtered result before the partial-results in registers $74_2$ and $74_3$ are updated. The steps illustrated in FIG. 7G, 7H, and 7I are then repeated for each new data sample.

In typical filters, the receipt of a new data sample triggers the calculation of a filtered result. In contrast, each of the filters and filter accelerators in accordance with the invention begin calculating the filtered result of the next data sample before the next sample arrives. This advance preparation saves valuable processing time.

As mentioned previously, the accelerator depicted in FIGS. 7A–7I includes three taps for simplicity, but can be adapted for use with more or fewer taps. For example, each additional tap can employ an additional register connected in series with register 71 and a multiplier $72_N$ connected between the output of the additional register and an input of adder $73_2$.

While the present invention has been described in connection with specific embodiments, variations of these embodiments will be obvious to those of ordinary skill in the art. For example, application of the invention is not limited to FIR filters, but may be extended for use with any signal-processing algorithm that depends upon a single final data point to produce a processed result. Therefore, the spirit and scope of the appended claims should not be limited to the foregoing description.

What is claimed is:

1. A system for processing digital signals, the system comprising:

a. a processor having:
   i. a processor input port adapted to receive a stream of N data samples;
   ii. a first multiplier having first and second multiplier-input ports and a first multiplier output port, wherein the first multiplier input port is connected to the processor input port;
   iii. a multiplexer having a first multiplexer input port connected to the first multiplier input port, a second multiplexer input port connected to the first multiplier output port, and a multiplexer output port; and
   iv. a first adder having first and second adder input ports and an adder output port, wherein the first adder input port is connected to the multiplexer output port; and b. an accelerator including:
   i. an accelerator input port connected to the processor input port and adapted to receive the stream of N data samples;
   ii. a weighting-coefficient register adapted to store N weighting coefficients and having a coefficient-register output port;
   iii. a second multiplier having:
      (1) a third multiplier input port coupled to the accelerator input port;
      (2) a fourth multiplier input port connected to the coefficient-register output port; and
      (3) a second multiplier output port;
      (4) wherein the second multiplier is adapted to successively multiply each data sample by each of the N weighting coefficients and to provide resulting data-sample products on the second multiplier output port;
   iv. a second adder having:
      (1) a third adder input port connected to the second multiplier output port;
      (2) a fourth adder input port; and
      (3) a second adder output port;
   v. a sum-of-products register coupled between the second adder output terminal and the fourth adder input terminal, the sum-of-products register adapted to store the sum of a series of data-sample products; and
   vi. an output register coupled between the second adder output port and the fourth adder input port;
   vii. wherein the second adder is adapted to provide a filter output by adding the contents of the sum-of-products register to the product of a current data sample and one of the weighting coefficients before the second multiplier multiplies the current data sample by the remaining weighting coefficients.

2. The system of claim 1, further comprising a second sum-of-products register coupled between the adder output port and the second adder input port, wherein the first-mentioned sum-of-products register stores the sum of N–1 products, and wherein the second sum-of-products register stores the sum of N–2 products.

3. The system of claim 2, further comprising a second multiplexer having third and fourth multiplexer input ports connected to the first and second sum-of-products registers, respectively, and a second multiplexer output port connected to the second adder input port.

4. A method of filtering a stream of N data samples, the method comprising:
  a. prior to receipt of the Nth data sample,
    i. multiplying the first N−1 data samples by respective N−1 weighting coefficients to obtain a plurality of data-sample products; and
    ii. summing the data-sample products to obtain a partial result; and
  b. after receipt of the Nth data sample,
    i. multiplying the Nth data sample by a respective Nth weighting coefficient to obtain an Nth data-sample product; and
    ii. adding the Nth data-sample product to the partial result;
  c. wherein an accelerator sums the data-sample products to obtain the partial result, the method further comprising passing the partial result from the accelerator to a processor adapted to multiply the Nth data sample by the respective Nth weighting coefficient at a first clock speed, and wherein the accelerator sums the data-sample products at a second clock speed different from the first clock speed.

5. The method of claim 4, wherein the processor is further adapted to add the product of the Nth data sample and the Nth weighting coefficient to the partial result.

6. A system for processing digital signals, the system comprising:
  a. a processor having:
    i. a first processor input port receiving a stream of N data samples;
    ii. a second processor input port receiving at least one filter coefficient;
    iii. a multiplier having a first multiplier input port connected to the first processor input port and a second multiplier input port connected to the second processor input port;
    iv. a multiplexer having a first multiplexer input port connected to the first multiplier input port, a second multiplexer input port connected to the multiplier output port, and a multiplexer output port;
    iv. an adder having a first adder input port connected to the first multiplexer output port, a second adder input port, and an adder output port; and
  b. an accelerator including:
    i. an accelerator input terminal connected to the first processor input port and receiving the stream of N data samples; and
    ii. an accelerator output port coupled to the second adder input port;
    iii. wherein the accelerator, prior to receipt of the Nth data sample, multiplies the first N−1 data samples by respective N−1 weighting coefficients to obtain a plurality of data-sample products and sums the data-sample products to obtain a partial result;
  c. wherein the processor, after receipt of Nth data sample, multiplies the Nth data sample by a respective Nth weighting coefficient to obtain an Nth data-sample product and adds the Nth data-sample product to the partial result.

7. The system of claim 6, wherein the accelerator multiplies the first N−1 data samples at a first clock rate and the processor multiplies the Nth data sample at a second clock rate different from the first clock rate.

8. The system of claim 7, wherein the second clock rate is greater than the first clock rate.

9. The system of claim 7, wherein the accelerator includes a single, second multiplier.

10. The system of claim 7, wherein the processor includes a second multiplexer having a third multiplexer input port connected to the second processor input port, a fourth multiplexer input port connected to the accelerator output port, and a second multiplexer output port connected to the second adder input port.

* * * * *